(12) United States Patent
Ando

(10) Patent No.: US 6,285,076 B1
(45) Date of Patent: *Sep. 4, 2001

(54) PRESS-CONNECTION SEMICONDUCTOR DEVICE AND PRESS-CONNECTION SEMICONDUCTOR ASSEMBLY

(75) Inventor: Masaru Ando, Kamakura (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/140,538

(22) Filed: Aug. 26, 1998

(30) Foreign Application Priority Data

Aug. 28, 1997 (JP) ................................. P9-232945

(51) Int. Cl.[7] .......................... H01L 23/48; H01L 23/34
(52) U.S. Cl. ................................. 257/688; 257/726
(58) Field of Search .................. 257/688, 726, 257/723

(56) References Cited

U.S. PATENT DOCUMENTS

| | | | |
|---|---|---|---|
| 5,483,103 | * 1/1996 | Blickhan et al. | 257/718 |
| 5,544,038 | * 8/1996 | Fisher et al. | 363/147 |
| 5,610,439 | * 3/1997 | Hiyoshi et al. | 257/688 |
| 5,956,231 | * 9/1999 | Yamada et al. | 361/728 |

* cited by examiner

Primary Examiner—Olik Chaudhuri
Assistant Examiner—Howard Weiss
(74) Attorney, Agent, or Firm—Finnegan, Henderson, Farabow, Garrett & Dunner, L.L.P.

(57) ABSTRACT

The semiconductor device has two sets of semiconductor units 13, having a plurality of semiconductor pellets 11 arranged and connected in parallel on the same plane, which are connected in series with a common electrode plate 14 intervened between the semiconductor units 13. An anode plate 15 and a cathode plate 16 are arranged in parallel on both sides of the semiconductor units 13. These electrode plates are pushed against the opposed main faces of the semiconductor pellets 11 by pushing force of coned disc springs 17. A press-connecting screw member consisting of a through bolt 21 and a nut 22 is set through the center of the semiconductor units and the like. A pushing force is uniformly applied to respective parts of the electrode plates without being dispersed, and the electrode plates are securely pushed against the respective semiconductor pellets 11. Thus, the semiconductor pellets 11 and the electrode plates and the like are securely connected by press connecting, thereby preventing a fatigue failure or breakage due to a difference in thermal expansion coefficient from being caused even if heating and cooling are repeated while the semiconductor device is operating.

9 Claims, 8 Drawing Sheets

PRESS-CONNECTION SEMICONDUCTOR DEVICE AND PRESS-CONNECTION SEMICONDUCTOR ASSEMBLY

BACKGROUND OF THE INVENTION

1. Field of the Invention

The invention relates to a press-connection semiconductor device and a press-connection semiconductor assembly, and more particularly to a press-connection power semiconductor device with reliability improved in terms of a temperature cycle test and a power cycle test.

2. Description of the Related Art

Conventionally, a high-power semiconductor device is used for an inverter which is used to control the running speed of a drive motor in an electric vehicle, an air conditioner, various types of machine tools and the like.

FIG. 8 and FIG. 9 show a configuration of such a conventional power semiconductor device.

In the drawings, reference numeral 1 denotes a ceramic wiring substrate, which has a wiring layer 1a of a copper foil formed on both faces of a ceramic substrate such as aluminum nitride or aluminum oxide (alumina). Two types of semiconductor elements 2 of IGBT (insulated gate bipolar transistor) and FRD (fast recovery diode) are die-bonded by soldering at predetermined positions on the main face of the ceramic wiring substrate 1. The ceramic wiring substrate 1 having the semiconductor elements 2 is soldered onto a copper radiator plate 3. The ceramic wiring substrate 1 mounted onto the copper radiator plate 3 is accommodated into a casing 8 of insulating resin having an anode member 4, a cathode member 5, a common electrode member 6, and a plurality of signal terminals 7. Electrode pads of the semiconductor elements 2 and the wiring layer 1a of the ceramic wiring substrate 1, said wiring layer 1a and the electrode members mounted on the casing 8 are wire-bonded with an Al wire 9. It is not shown but the wire-bonded portion is covered with a sealing layer of insulating resin and further covered with a cap.

When such a semiconductor device is subjected to a thermal cycling or power cycling, a stress is applied to the semiconductor device due to a difference in thermal expansion coefficient among the different materials used. This thermal stress has a possibility of causing a fatigue failure or breakage in a solder connection or a connection of the bonding wire.

Specifically, in the conventional semiconductor device, the ceramic wiring substrate 1 and the semiconductor element 2 are bonded with Sn—Pb solder, and the electrode pads of the semiconductor element 2 and, the wiring layer 1a of the ceramic wiring substrate 1, said wiring layer 1a and the electrode member are connected by wire bonding. Accordingly, a temperature of the device as the whole rises and drops repeatedly because of heating generated when the semiconductor element 2 is operating, leading to a fatigue in the solder connecting portions or the joint of the Al wire 9, and possibly resulting in breaking the device.

SUMMARY OF THE INVENTION

The present invention was achieved to remedy the problems described above. It is an object of the invention to provide a power semiconductor device and a semiconductor assembly, which excel in electrical characteristics, and especially have improved reliability in terms of temperature cycle and power cycle.

A press-connection semiconductor device, comprises a semiconductor unit, which has a plurality of semiconductor elements, the element having two main faces with electrode pads, arranged on the same plane so to enable parallel connection; heat buffer layers, which are arranged in contact with both the main faces of the semiconductor elements; electrode plates, which interpose the semiconductor unit between them and are electrically in contact with the electrode pads of the semiconductor elements; spring members, which push the electrode plates in the direction of normal line of the main faces of the semiconductor elements; a engaging rod, which is disposed to pierce through the centers of the semiconductor unit and also the electrode plates; and a clamping member, which is joined to the engaging member to control the pushing force of the spring members.

The press-connection semiconductor device of the invention may have a heat sink disposed on the outside of the spring members. The heat sink can be a supporting member made of aluminum, copper or ceramic. Otherwise, the heat sink can be an aluminum supporting member having fins.

The semiconductor element configuring the semiconductor unit can have, for example, a plurality of IGBTs (insulated gate bipolar transistors) and a plurality of diodes in combination.

The semiconductor device having the semiconductor unit configured by combining the plurality of IGBTs and the plurality of diodes may further comprises a gate extending structure, having a probe pin, a spring fixed to the rear end of the probe pin, a printed circuit board having necessary wiring on its main face, connected to the gate electrodes of the IGBTs.

The semiconductor device having the IGBTs and the diodes in the semiconductor unit preferably has the IGBTs and the diodes alternately arranged around the engaging rod, and the IGBTs positioned at corners. Besides, the gate electrode of the IGBT is preferably located at corner near a direction that the gate electrode is extended.

A press-connection semiconductor assembly of the invention has three of the press-connection semiconductor devices described above, which are arranged in a direction parallel to the axial direction of the engaging rod, and all the electrode plates of the semiconductor devices being extended in the same direction.

A single set (unit) or a plural sets of semiconductor units having a plurality of semiconductor elements such as IGBTs and FRDs arranged on the same plane are disposed in series, intervened between two electrode plates. These electrode plates are pushed by spring members in a direction perpendicular to the main faces of the semiconductor elements so to be press-contacted to the electrode pads of the respective semiconductor elements through a heat buffer layer.

Thus, in the semiconductor device and assembly of the present invention, the semiconductor elements configuring the respective semiconductor units are connected in parallel through the means of electrode plates, and the semiconductor units are connected in series to one another. Thus, the required electrical connection is made without soldering or wire bonding. Therefore, the connecting portion does not suffer from a fatigue failure or breakage caused due to a difference in thermal expansion coefficient among the members used even if a cyclic temperature change, such as heating and cooling caused when the semiconductor elements are operating, is repeated. Connection reliability is thus improved substantially.

Inductance is also small because the respective electrode plates are closely arranged with the semiconductor elements intervened between them and an electrode-to-electrode distance is small. Besides, when the semiconductor elements are operating, mutual inductance operates because of the short electrode-to-electrode distance, so that total inductance of the elements is also lowered substantially as compared with the conventional device.

In addition, the spring member serves to press the respective electrode plates in a direction perpendicular to the main faces of the semiconductor elements. A pushing force of the spring member is controlled by a clamping member, so that it is applied uniformly to each part of the electrode plates without being dispersed, and the electrode plates are pushed against the semiconductor elements by a necessary and sufficient force.

DETAILED DESCRIPTION OF THE PREFERRED EMBODIMENTS

Preferred embodiments of the invention will be described with reference to the accompanying drawings.

Embodiment 1

Figure 1:
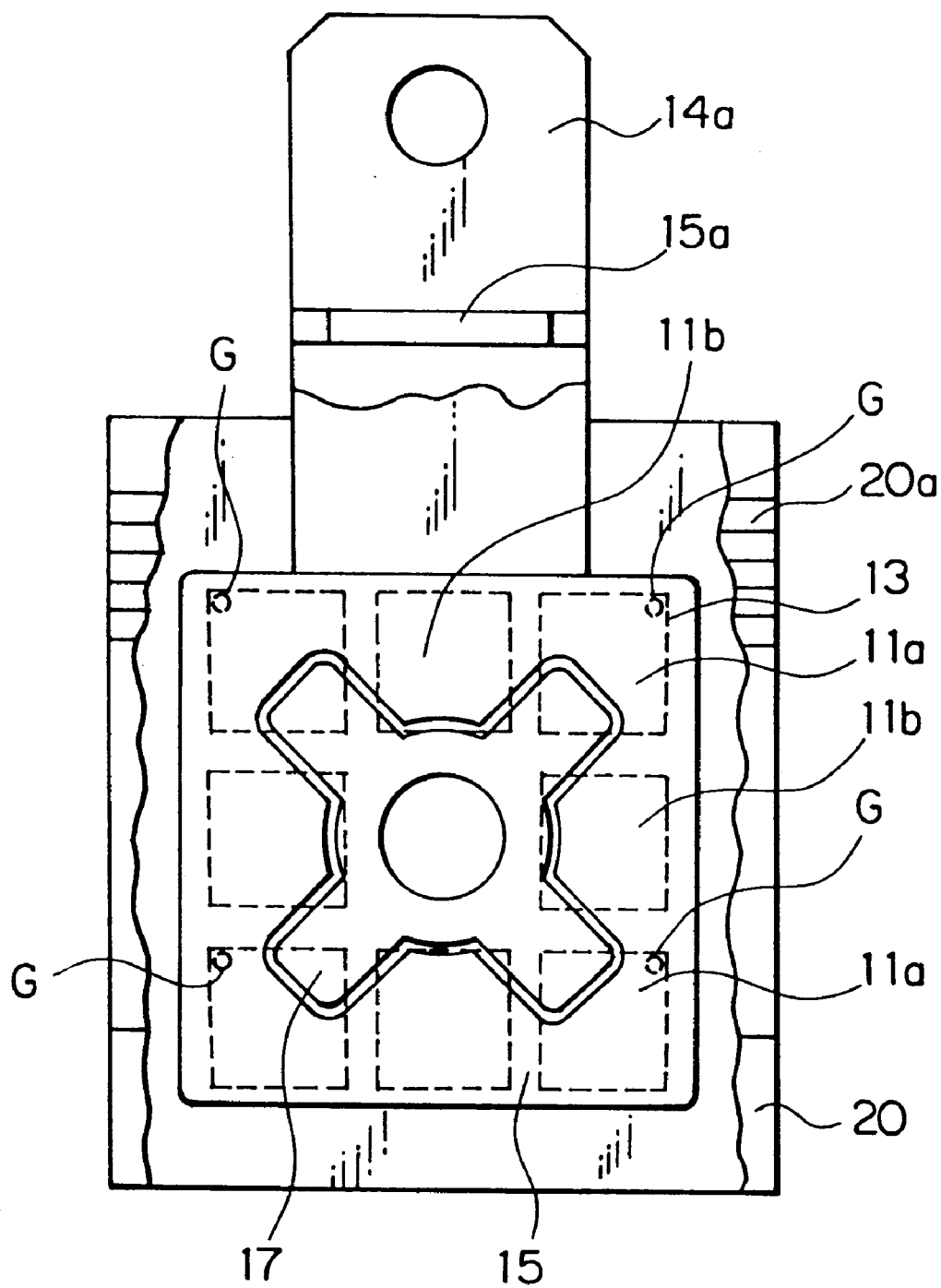
FIG. 1 is a partially cutaway front view showing a first embodiment of the press-connection semiconductor device of the present invention, wherein a through bolt as an engaging member is removed.
Figure 2:
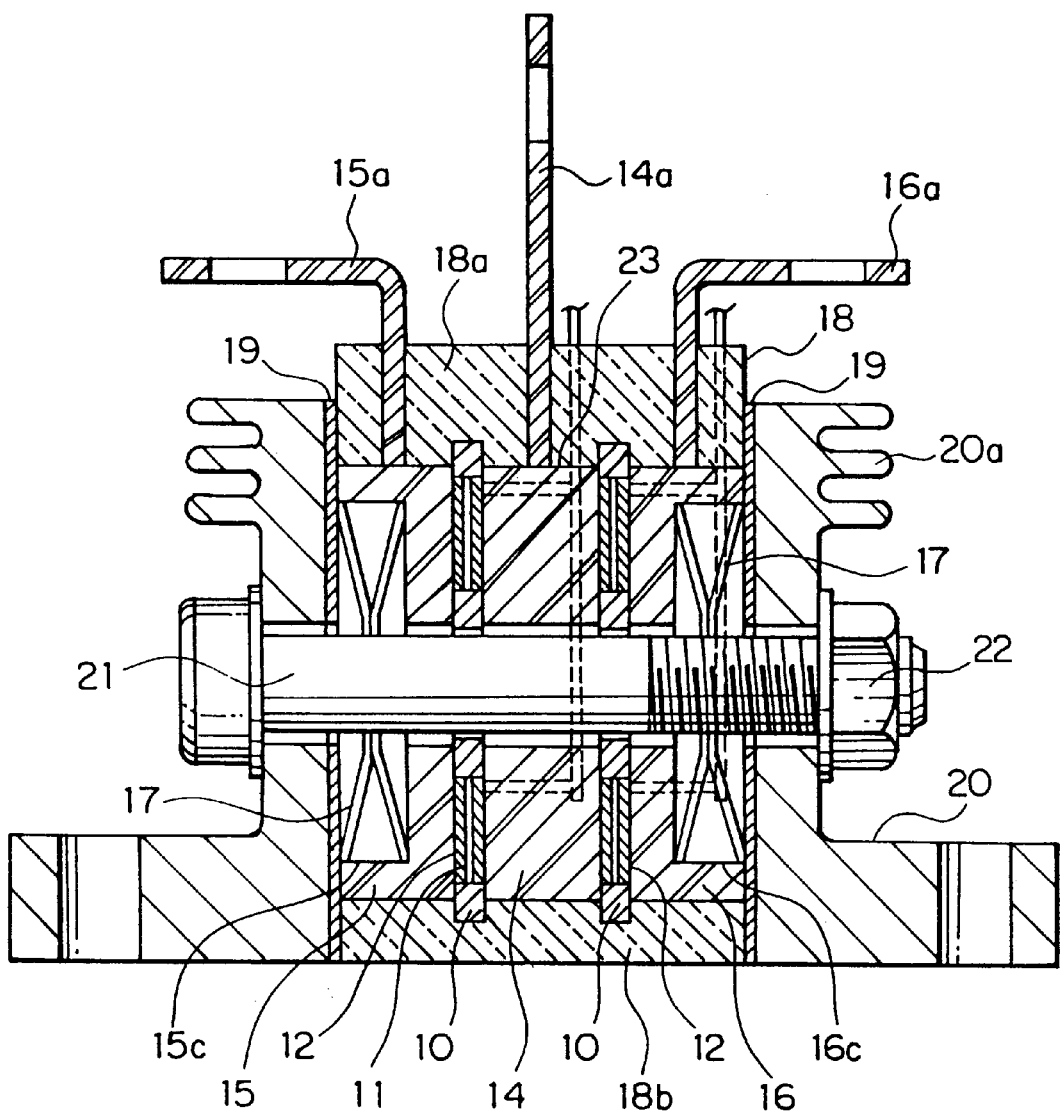
FIG. 2 is a vertical sectional view in a direction of the central axis of the semiconductor device of the first embodiment.
Figure 3:
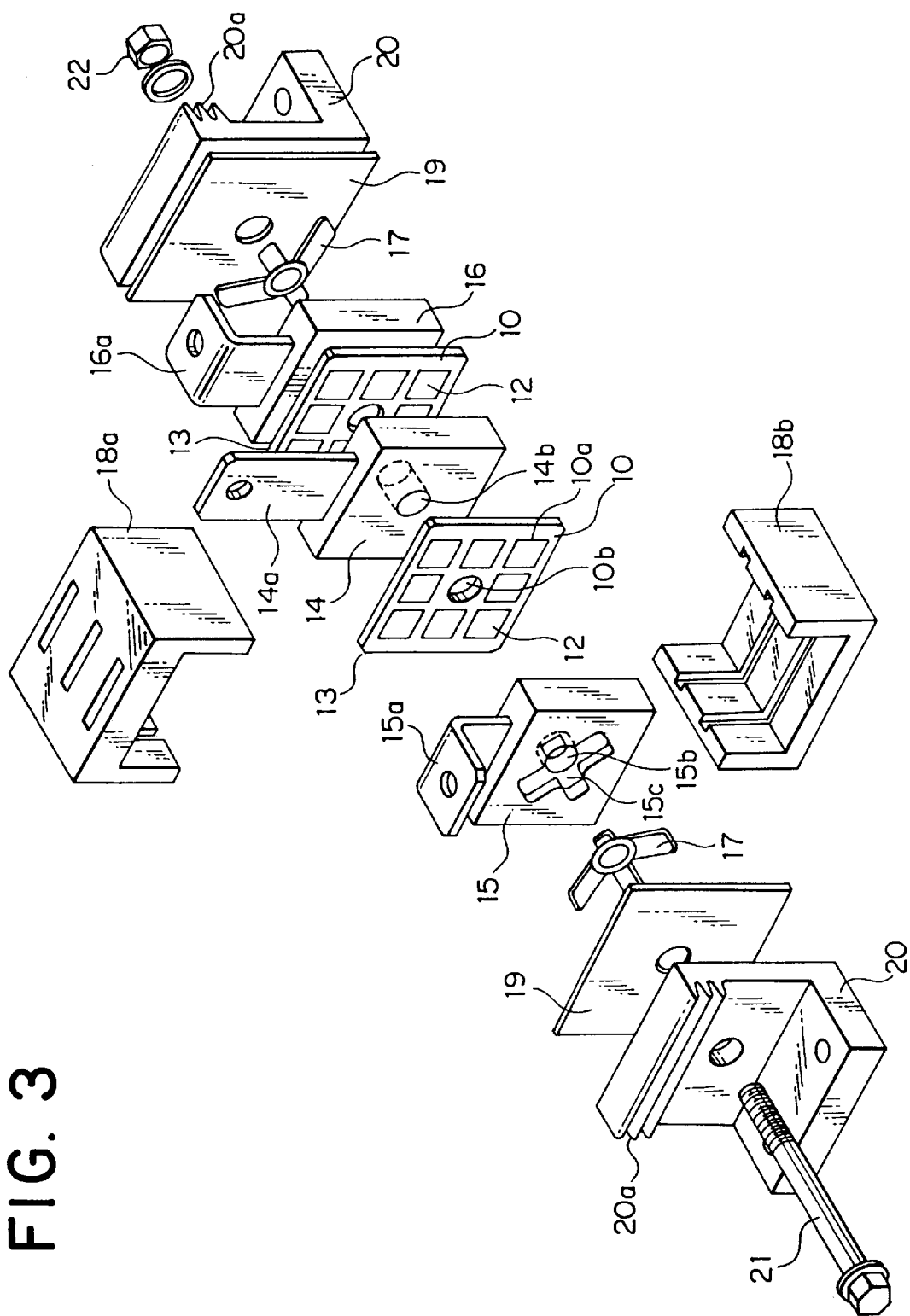
FIG. 3 is an exploded perspective view schematically showing a configuration of the semiconductor device of the first embodiment.

FIG. 1 is a front view showing a configuration of the press-connection semiconductor device of the first embodiment of the present invention. FIG. 2 is a vertical sectional view in a direction of the central axis of the semiconductor device of the first embodiment. And, FIG. 3 is an exploded perspective view schematically showing a configuration of the semiconductor device of the first embodiment (excluding a gate electrode extending configuration).

In the drawings, reference numeral 10 denotes pellet guides made of an insulating resin, which have a plurality (e.g., eight) of rectangular open windows 10a and an insertion hole 10b for a through bolt formed at the center. A plurality (e.g., four) of rectangular IGBTs 11a and a plurality (e.g., four) of rectangular FRDs 11b are fitted into the open windows 10a of the pellet guide 10. A molybdenum (Mo) disk 12 is overlaid as a heat buffer plate on both main faces of the semiconductor pellets 11. The semiconductor pellets 11 are disposed so that the IGBTs 11a and the FRDs 11b are alternately arranged around the bolt insertion hole 10b, and the IGBTs 11a are located at the four corners. A gate electrode G is formed at the upper corners of each of the IGBT 11a so to be close to the upper part in an extending direction (upward) taking into account that extension wiring can be made short and an extending structure can be made with ease.

Thus, the IGBTs 11a and the FRDs 11b are positioned and located on the same plane by the pellet guides 10 to configure a semiconductor unit 13. Two sets (two units) of such semiconductor units 13 are erected with a copper common electrode plate 14 having the bolt insertion hole 14b at the center, an external connection terminal 14a protruded upward at the top, interposed between them.

A pair of copper electrode plates (an anode plate 15 and a cathode plate 16), which has external connection terminals 15a, 16a and bolt insertion holes 15b, 16b in the same manner as the common electrode plate 14, is disposed on the outside faces of the erected semiconductor units 13. Recess portions 15c, 16c are also formed to surround the bolt insertion holes 15b, 16b on the external faces of the anode plate 15 and the cathode plate 16, and a coned disc spring 17 is fitted into the recesses 15c, 16c. The members described above are fully covered with a box housing 18 consisting of an upper casing 18a and a lower casing 18b which are made of an insulating resin such as polyphenylene sulfide or polybutylene terephthalate. And the box housing 18 and the electrode plates and so on are adhered with an adhesive agent (not shown) for airtight sealing.

Besides, cooling fin-plates 20 made of aluminum with fins 20a formed at the upper part are arranged on the outer faces of the anode plate 15 and the cathode plate 16 so to cover the recesses 15c, 16c, where the individual coned disc spring 17 is fitted, with a thin layer 19 of ceramic such as aluminum nitride or alumina intervened therebetween. Then, a through bolt 21 is inserted through the bolt insertion holes of the cooling fin-plates 20 and the respective electrode plates (the anode plate 15, the cathode plate 16 and the common electrode plate 14) and also the bolt insertion holes of the pellet guides 10. A nut 22 is set onto a screw thread of the through bolt 21 to unite the respective components into one body. By controlling a tightening strength of the nut 22, pressing forces of the coned disc springs 17 acting in an insertion direction (axial direction) of the through bolt 21 is controlled so to press the respective electrode plates against the main faces of the semiconductor pellets 11 through the molybdenum discs 12.

Furthermore, the gate electrodes G of the respective IGBTs 11a are provided with a gate electrode extending structure 23 to be described below.

Figure 4:
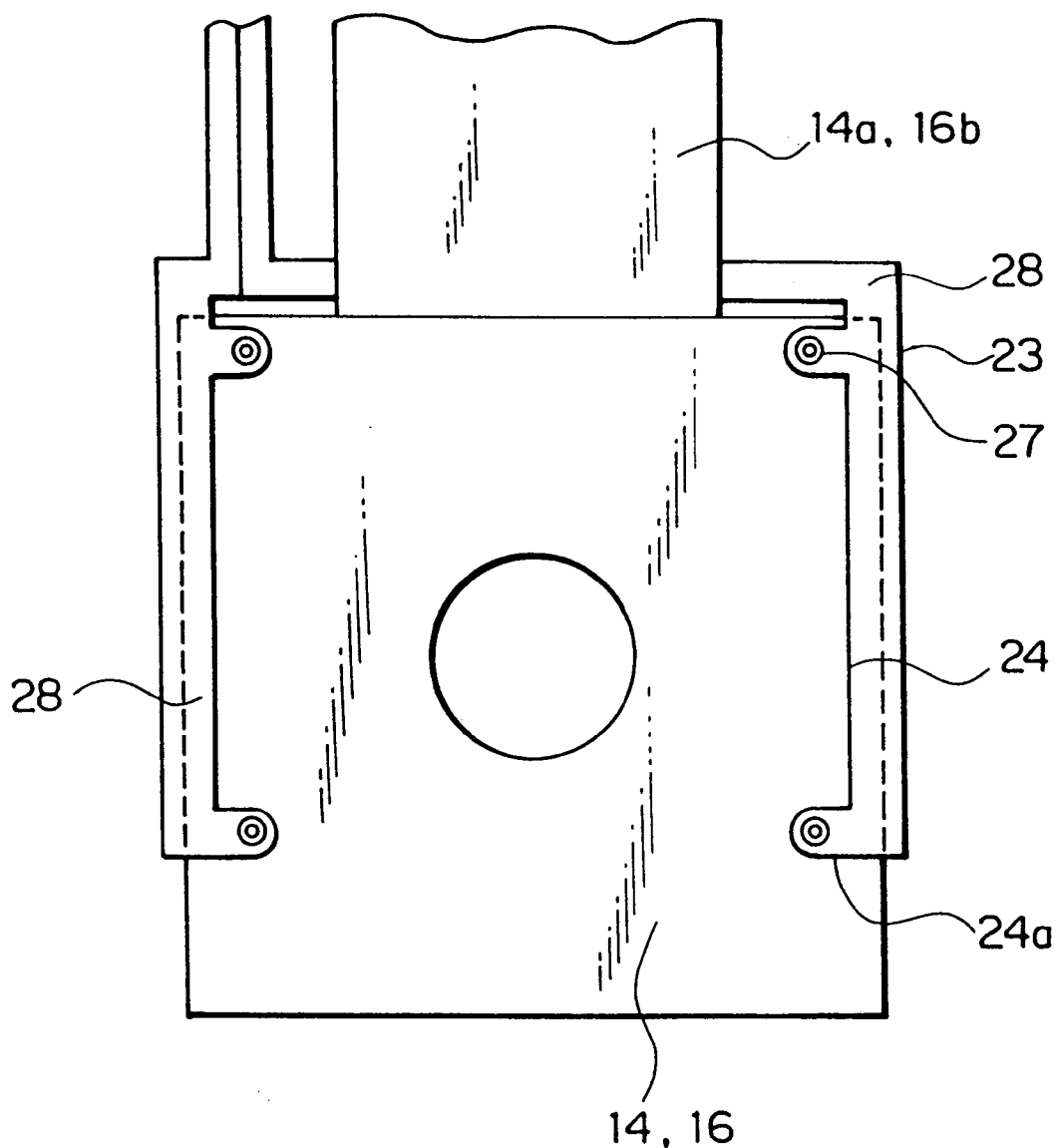
FIG. 4 is a front view showing a configuration of a gate electrode extending part in the press-connection semiconductor device of the first embodiment.
Figure 5:
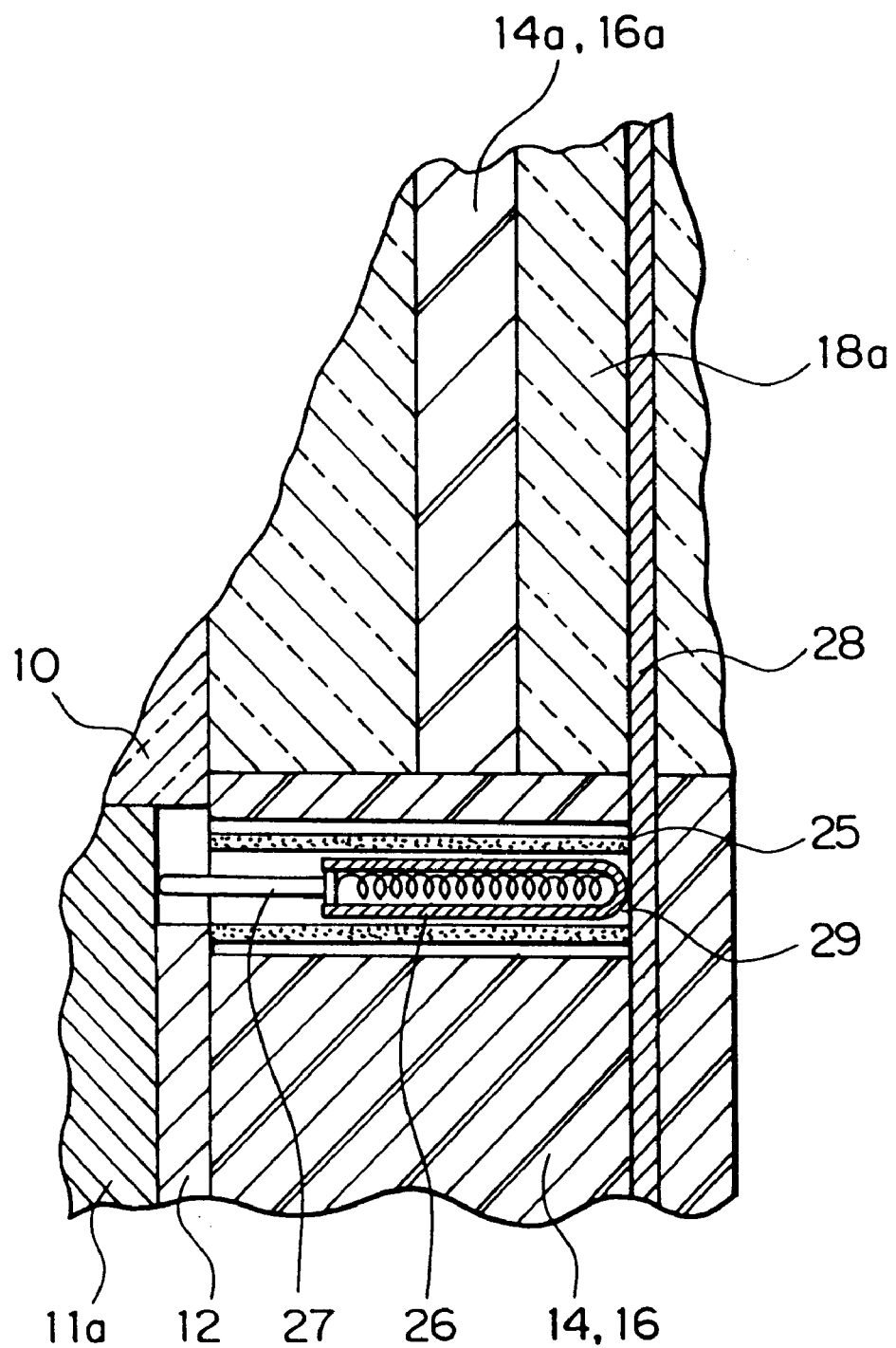
FIG. 5 is an enlarged partially sectional view showing a structure of the gate electrode extending part.

Specifically, as shown in FIG. 4 and FIG. 5, the common electrode plate 14 and one of the electrode plates (e.g., the cathode plate 16) have step-like cutaway portions 24 on both sides of their faces opposed to the gate electrodes G of the IGBTs 11a, and the cutway portion 24 has grooves 24a in positions to correspond with the gate electrodes G of the IGBTs 11a. A cylindrical guide pipe 25 made of an insulating resin is fitted into the groove 24a. A probe pin 27 having a coil spring 26 fixed to its back end is concentrically inserted into the guide pipe 25. A leading end of the probe pin 27 is concentrically pieced through an opening (without contacting to the inner surface of the opening) formed in the molybdenum disk 12 so to come in contact with the gate electrode G of the IGBT 11a. A glass-epoxy printed circuit board (PCB) 28 having a squared U-shape (like an open square frame), is fitted into the step-like cutaway portion 24 of the common electrode plate 14 and the cathode plate 16.

The base end of a conductive sheath 29 covering the coil spring 26 is in contact with the wiring of the open frame-shaped PCB 28, so that the probe pin 27 is connected with the wiring of PCB 28 through the conductive sheath 29.

Figure 6:
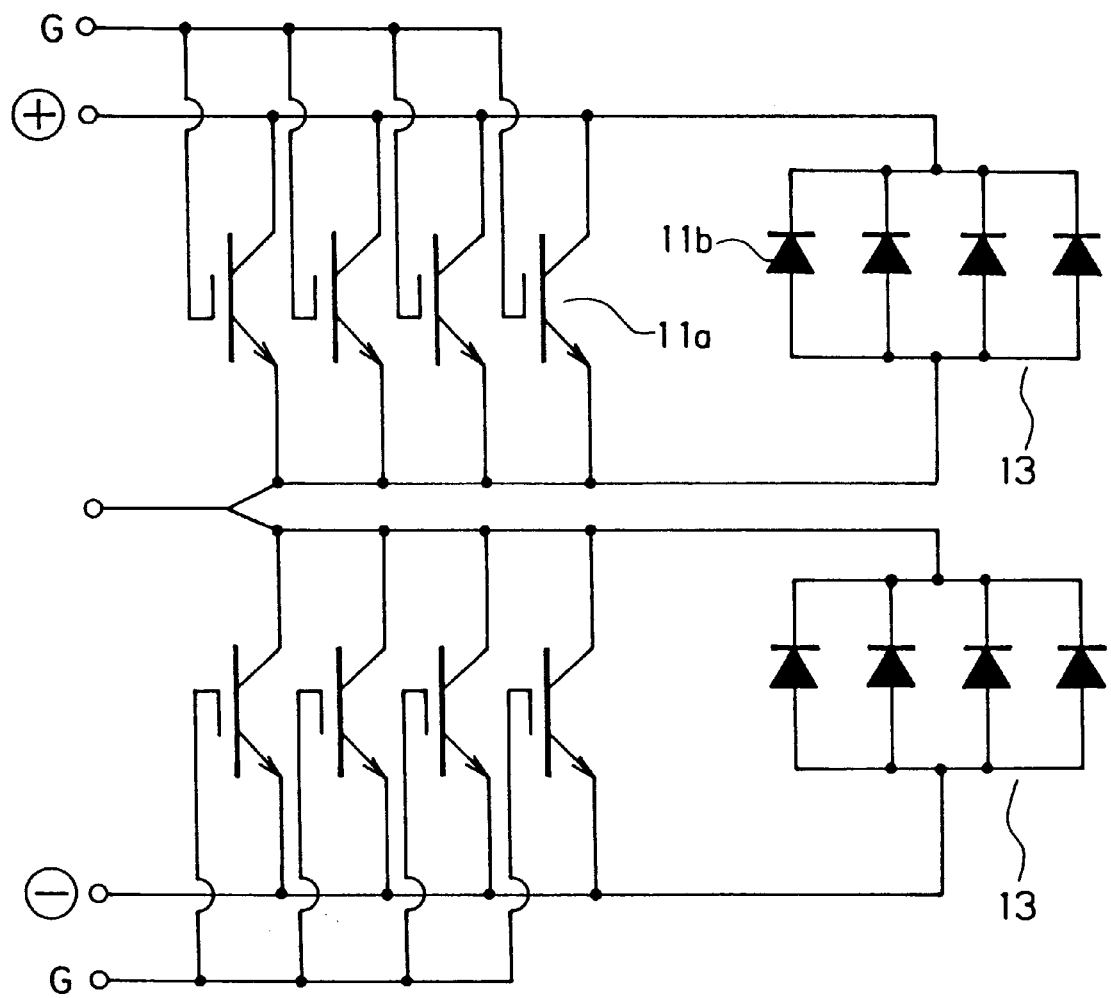
FIG. 6 is an equivalent circuit diagram of the semiconductor device of the first embodiment.

FIG. 6 is an equivalent circuit diagram showing an electrical connecting configuration of the semiconductor device of this embodiment.

It is seen from FIG. 6 that the device of this embodiment has the semiconductor unit 13, which comprises the four IBGTs 11a and the four FRDs 11b, respectively connected in parallel. Two sets of the semiconductor units 13 are mutually connected in series by the common electrode intervened between them, and both sides (emitter and collector sides) are respectively connected to the anode and the cathode. The gate electrode G of the individual IGBT 11a is lead outside through the means of the electrode extending structure.

In the semiconductor device of the embodiment configured as described above the two sets of semiconductor units 13, the unit having the four IGBTs 11a and the four FRDs 11b connected in parallel on the same plane, are connected in series with the common electrode plate 14 intervened therebetween, and the anode plate 15 and the cathode plate 16 are positioned on their both sides. These electrode plates are pressed against the main face of the semiconductor pellet 11 by the pushing force of the coned disc springs 17. Thus, the semiconductor pellet 11 and the electrode plates are connected not by soldering or wire bonding but by press connecting. Therefore, heating and cooling do not cause a fatigue failure or breakage due to a difference in thermal expansion coefficient when the semiconductor device is being used. Consequently, reliability is improved substantially in terms of temperature cycle and power cycle.

For example, when a temperature cycle test (−40° C.×30 minutes to 125° C.×30 minutes) was undergone, a conventional non-press connection type semiconductor device had an open junction of a bonding wire or the like at 300 cycles, but the semiconductor device of the embodiment did not have an open portion even at 1,000 cycles or more. When a power cycle test was performed repeating two-second ON and 18-second OFF by flowing a rated current of 500 to 600A, the conventional semiconductor device had a fatigue failure or breakage at 10,000 cycles, while the semiconductor device of the embodiment did not have a fatigue failure or breakage even after exceeding 100,000 cycles, proving that reliability of connection was improved dramatically.

Besides, the semiconductor device of the embodiment has each electrode plate closely arranged with the thin semiconductor pellets 11 intervened between them so to have a decreased distance between the electrodes, so that an inductance is decreased. Since the electrode-to-electrode distance is decreased and a mutual inductance operates when the semiconductor pellets 11 operate, a total inductance of the elements is substantially lowered to about ⅓ or below of that in the conventional semiconductor device. A current path is also decreased to ⅓ or below of that of the conventional semiconductor device.

Furthermore, the electrode plates are interposed between and pressed from both sides by the coned disc springs 17. Each electrode plate is also pressed against the main faces of the opposed semiconductor pellets 11 by the press-connecting screw member consisting of the through bolt 21, pierced through the electrode plates, semiconductor units 13 and the like at their centers, and the nut 22. Thus, a pushing force is not dispersed but uniformly applied to every parts of the electrode plates, so that the electrode plates are securely pressed against the respective semiconductor pellets 11. In addition, the pushing forces of the coned disc springs 17 can be controlled by adjusting the tightening force of the nut 22 so that the springs 17 can push the electrode plates against the semiconductor pellets 11 by a necessary and sufficient force. The semiconductor pellets 11 are arranged on the vertical faces and three-dimensionally mounted in a high density. Therefore, an installation space (an installation area) can be decreased to about ½ of that of the conventional semiconductor device.

Embodiment 2

Figure 7A:
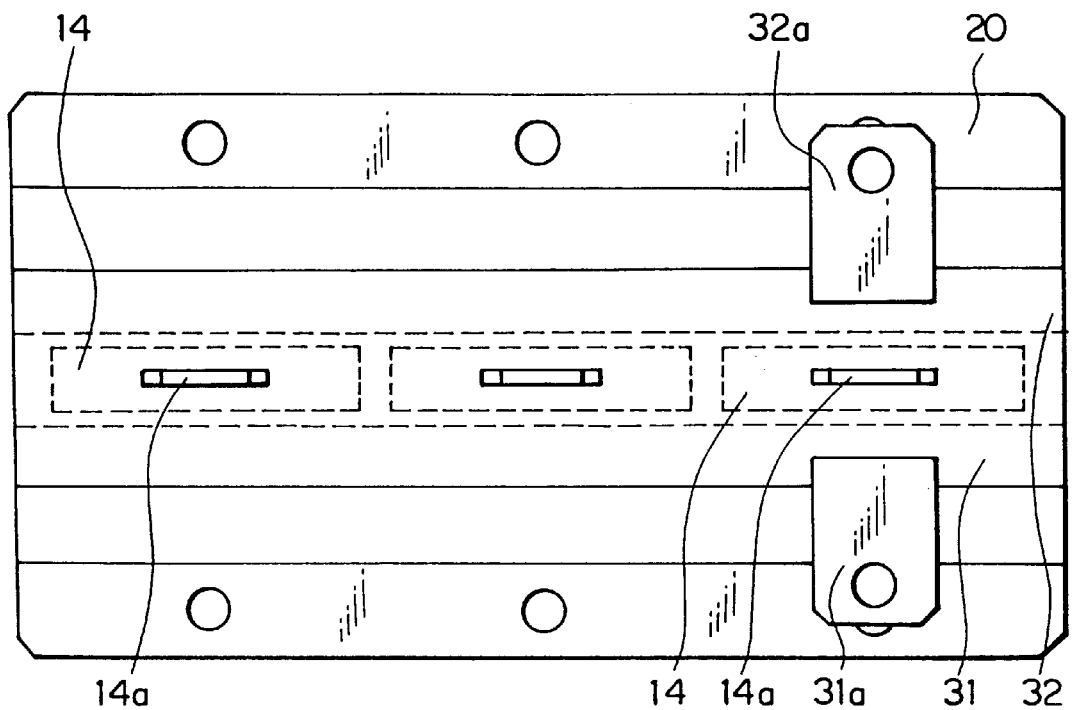
FIG. 7A and FIG. 7B are respectively a top view and a partially cutaway front view showing a schematic configuration of the press-connection semiconductor assembly of a second embodiment of the invention.
Figure 7B:
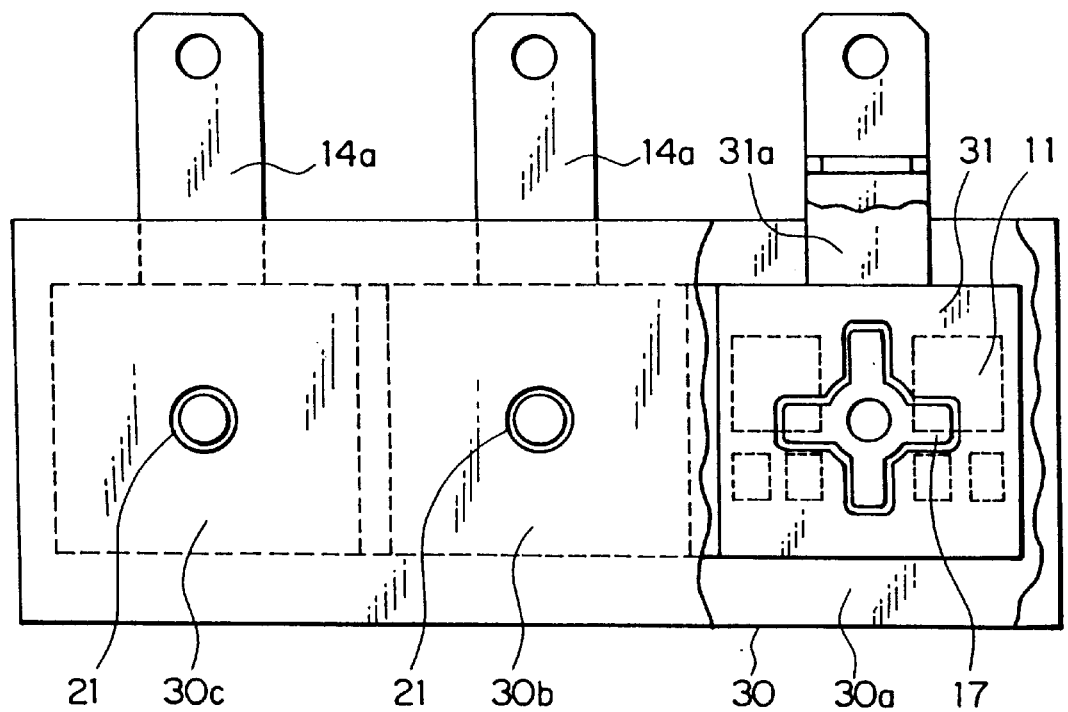
Figure 8:
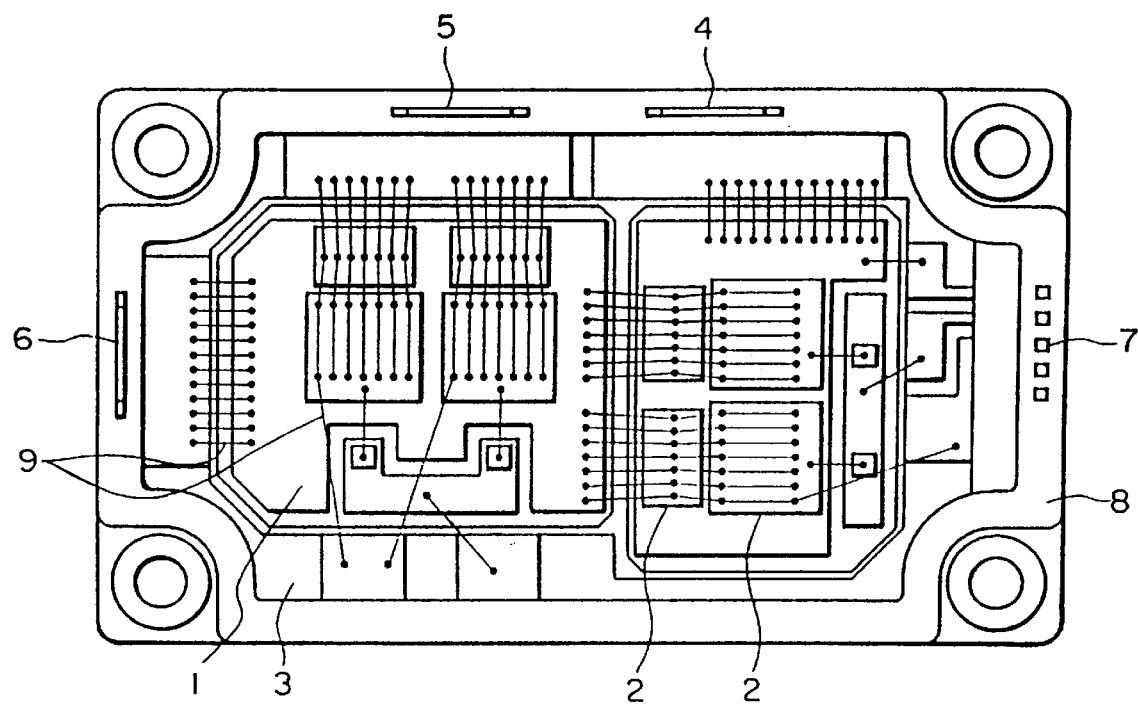
FIG. 8 is a plane view of a conventional power semiconductor device.
Figure 9:
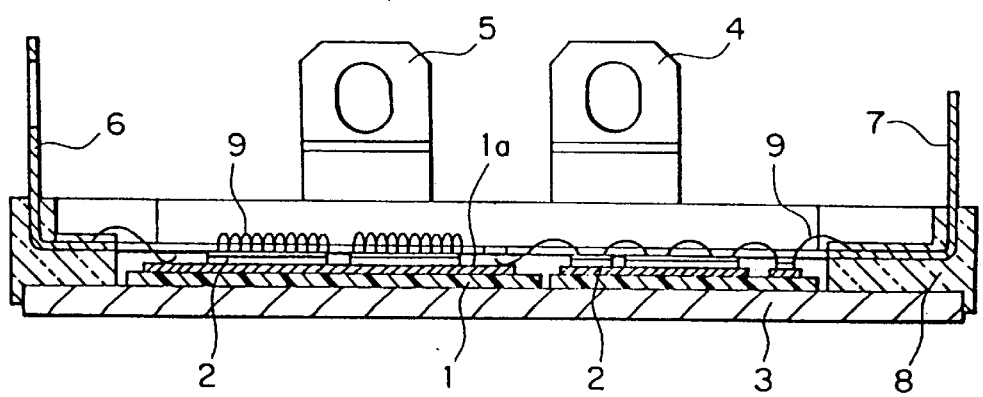
FIG. 9 is a partially sectional view schematically showing a configuration of the conventional power semiconductor device.

FIG. 7A and FIG. 7B show a configuration of the press-connection semiconductor assembly of the second embodiment of the invention. In the drawings, the same reference numerals as in FIG. 1 and FIG. 2 are used for the same components and their descriptions are omitted.

In this semiconductor assembly, three semiconductor devices 30a, 30b, 30c having the same configuration as in the previous embodiment (first embodiment) are arranged in a parallel to a direction that the through bolt 21 is pierced. The individual semiconductor device has an individual common electrode plate 14. As the anode plate and the cathode plate, the three semiconductor devices have a unified anode plate 31 and a unified cathode plate 32 disposed commonly. And the respective semiconductor devices are connected in parallel through the means of these unified electrode plates. In the semiconductor device 30a at one end, external connection terminals 31a, 32a are formed to protrude from the tops of the unified anode plate 31 and the unified cathode plate 32 and extended upward in the same way as the common electrode plate 14.

The semiconductor assembly of the second embodiment configured as described above has reliability improved substantially in terms of the temperature cycle test or power cycle test because the connection of the semiconductor pellets 11 with the electrode plates and the like is securely made by press connecting. Besides, a plurality of semiconductor pellets 11 is mounted in a higher density, the unified anode plate 31 and the unified cathode plate 32 common to the three semiconductor devices 30a, 30b, 30c are disposed, and these unified electrode plates are extended upward in the same way as the common electrode plate 14. Thus, this semiconductor assembly has advantages that connection to a bus conductor, such as a bus bar, for power feeding is easy, and a connecting structure is simplified.

In the embodiments described above, description was made of the configuration having the cooling fin-plates 20 which are made of aluminum formed as a heat sink on the outside of the anode plate 15 and the cathode plate 16, which have the coned disc spring 17 fitted therein. But, the heat sink can be a water-cooling pipe through which cooling water is flown and can also be made of a ceramic material. In other words, instead of the aluminum cooling fin-plates 20, ceramic supporting members having the functions as the heat sink may be used to hold the electrode plates and the semiconductor units 13 between them.

In addition, the external connection terminals 15a, 16a of the anode plate 15 and the cathode plate 16 are not necessarily required to be bent but preferably bent at their upper parts in order to connect to the bus bar or the like. Furthermore, the spring member for pushing the electrode plates against the main faces of the semiconductor pellets 11 is not limited to the coned disc spring 17 made of spring steel but may be a spring member made of a variety of materials and having a variety of shapes. The spring can also be made of resin.

Moreover, only diodes can be used as the semiconductor pellet 11. In such a case, it is not necessary to have the gate electrode extension structure, so that the configuration of the whole device having the semiconductor pellets 11 and the respective electrode plates press-connected can be simplified furthermore.

As described above, the present invention can provide a press-connection type semiconductor device and a semiconductor assembly, which have excellent electrical characteristics and also improved reliable connections in terms of the temperature cycle and power cycle.

What is claimed is:

1. A press-connection semiconductor device, comprising:
   a plurality of semiconductor units, the semiconductor units having a plurality of semiconductor elements, the elements having two main faces with electrode pads, arranged on the same plane so to enable parallel connection;
   heat buffer layers, which are arranged in contact with both the main faces of the semiconductor elements;
   a common electrode plate, which is interposed between the semiconductor units and is electrically in contact with the electrode pads of the semiconductor elements;
   an anode plate and a cathode plate, which are disposed on outside faces of the semiconductor units and are electrically in contact with the electrode pads of the semiconductor elements;
   spring members, which push the anode plate and the cathode plate from both sides in the direction of normal line of the main faces of the semiconductor elements;
   an engaging rod, which is disposed to pierce through the centers of the semiconductor unit and also the common electrode plate, the anode plate and the cathode plate; and
   a clamping member, which is joined to the engaging rod to control the pushing force of the spring members.

2. The press-connection semiconductor device according to claim 1, wherein a heat sink is disposed on the outside of the spring members.

3. The press-connection semiconductor device according to claim 2, wherein the heat sink is a supporting member made of aluminum, copper or ceramic.

4. The press-connection semiconductor device according to claim 2, wherein the heat sink is a supporting member having fins, made of aluminum.

5. The press-connection semiconductor device according to claim 1, wherein semiconductor elements consist of a plurality of insulated gate bipolar transistors (IGBT) and a plurality of diodes, and each semiconductor unit has the plurality of IGBTs and the plurality of diodes.

6. The press-connection semiconductor device according to claim 5, further comprising a gate extending structure, having a probe pin, a spring fixed to the rear end of the probe pin, a printed circuit board having necessary wiring on its main face, connected to the gate electrodes of the IGBTs.

7. The press-connection semiconductor device according to claim 5, wherein the IGBTs and the diodes are alternately arranged around the engaging member, and the IGBTs are positioned at corners.

8. The press-connection semiconductor device according to claim 5, wherein the gate electrode of the IGBT is located at corner near a direction that the gate electrode is extended.

9. A press-connection semiconductor assembly, comprising:
   three of the press-connection semiconductor devices as set forth in claim 1,
   wherein the press-connection semiconductor devices are disposed so that the engaging rods are arranged in parallel to one another, and all the electrode plates of the semiconductor devices are extended in the same direction.

\* \* \* \* \*